United States Patent [19]
Chen et al.

[11] Patent Number: 5,930,673
[45] Date of Patent: Jul. 27, 1999

[54] METHOD FOR FORMING A METAL CONTACT

[75] Inventors: Fusen E. Chen, Dallas; Fu-Tai Liou; Yih-Shung Lin, both of Carrollton; Girish A. Dixit, Dallas; Che-Chia Wei, Plano, all of Tex.

[73] Assignee: STMicroelectronics, Inc., Carrollton, Tex.

[21] Appl. No.: 08/418,122

[22] Filed: Apr. 6, 1995

Related U.S. Application Data

[63] Continuation of application No. 08/146,825, Nov. 1, 1993, abandoned, which is a continuation of application No. 07/835,731, Feb. 11, 1992, abandoned, which is a continuation of application No. 07/609,883, Nov. 5, 1990, Pat. No. 5,108,951.

[51] Int. Cl.$^6$ .................................................. H01L 21/283
[52] U.S. Cl. ........................................... 438/643; 438/688
[58] Field of Search .................................... 437/194, 197, 437/203, 187, 247; 148/DIG. 25, DIG. 158; 204/192.1; 427/96, 97

[56] References Cited

U.S. PATENT DOCUMENTS

| | | | |
|---|---|---|---|
| 3,158,504 | 11/1964 | Anderson | 117/213 |
| 3,900,598 | 8/1975 | Hall et al. | 427/90 |
| 4,107,726 | 8/1978 | Schilling | 357/71 |
| 4,502,209 | 3/1985 | Eizenberg et al. | 427/88 |
| 4,566,177 | 1/1986 | van de Ven | 148/1.5 |

(List continued on next page.)

FOREIGN PATENT DOCUMENTS

| | | |
|---|---|---|
| 0 107 259 A3 | 5/1984 | European Pat. Off. . |
| 0 137 701 A1 | 4/1985 | European Pat. Off. . |
| 0 168 828 A2 | 1/1986 | European Pat. Off. . |
| 0 257 277 A2 | 3/1988 | European Pat. Off. . |
| 0 269 019 A3 | 6/1988 | European Pat. Off. . |

(List continued on next page.)

OTHER PUBLICATIONS

Wolf et al. "Aluminum Thin Films And Physical Vapor Deposition in VLSI"; "Silicon Processing For The VLSI Era", Lattice Press, 1986 pp. 332–334 and 367–374.

TiN Metallization Barriers: From 1.2$\mu$ to 0.35$\mu$ Technology Fabio Pintchovski and Ed Travis, Motorola, Inc., Austin, Texas pp. 777–786, 1992 Materials Research Society.

Development of a Planarized Al–Sl Contact Filling Technology Hisako Ono, et al., VMIC Conference, Jun. 1990, pp. 76–82.

Aluminum Metallization for ULSI, Dipankar Pramanik et al., Solid State Technology Mar. 1990, No. 3, Westford, MA. pp. 73–79.

Thin–film reactions of Al with Co, Cr, Mo, Ta, Ti, and W E. G. Colgan, et al., vol. 4, No. 1989 Materials Research Society, pp. 815–820.

Planarized Aluminum Deposition on TiW and TiN Layers by High Temperature Evaporation, G. E. Georgiou, et al., AT&T Bell Laboratories, Jun. 1989 VMIC Conference, pp. 315–321.

The properties of aluminum thin films sputter deposited at elevated temperatures, M. Inoue et al., J. Vac. Sci. Technol. May 6, 1988, pp. 1636–1939.

(List continued on next page.)

*Primary Examiner*—David Graybill
*Attorney, Agent, or Firm*—Therdore E. Galanthay; Kenneth C. Hill; Lisa K. Jorgenson

[57] ABSTRACT

A method is provided for depositing aluminum thin film layers to form contacts in a semiconductor integrated circuit device. All or some of the deposition process occurs at relatively low deposition rates at a temperature which allows improved surface migration of the deposited aluminum atoms. Aluminum deposited under these conditions tends to fill contact vias without the formation of voids. The low temperature deposition step can be initiated by depositing aluminum while a wafer containing the integrated circuit device is being heated from cooler temperatures within the deposition chamber.

39 Claims, 1 Drawing Sheet

U.S. PATENT DOCUMENTS

| | | | |
|---|---|---|---|
| 4,592,802 | 6/1986 | Deleonibus et al. | 156/644 |
| 4,661,228 | 4/1987 | Mintz | 204/192.25 |
| 4,756,810 | 7/1988 | Lamont, Jr. et al. | 204/192.32 |
| 4,758,533 | 7/1988 | Magee et al. | 437/173 |
| 4,772,571 | 9/1988 | Scovell et al. | 437/200 |
| 4,837,183 | 6/1989 | Polito et al. | 437/198 |
| 4,892,844 | 1/1990 | Cheung | 437/194 |
| 4,944,961 | 7/1990 | Lu et al. | 427/314 |
| 4,970,176 | 11/1990 | Tracy et al. | 437/187 |
| 4,975,389 | 12/1990 | Ryan et al. | 437/197 |
| 4,976,839 | 12/1990 | Inoue | 204/192.17 |
| 4,988,423 | 1/1991 | Yamamoto | 437/192 |
| 4,994,162 | 2/1991 | Armstrong et al. | 204/192.12 |
| 5,106,781 | 4/1992 | DeVries | 437/192 |
| 5,108,570 | 4/1992 | Wang | 204/192.15 |
| 5,108,951 | 4/1992 | Chen et al. | 437/194 |

FOREIGN PATENT DOCUMENTS

| | | |
|---|---|---|
| 0 273 715 A2 | 7/1988 | European Pat. Off. . |
| 0 276 087 A2 | 7/1988 | European Pat. Off. . |
| 0 310 108 A2 | 4/1989 | European Pat. Off. . |
| 0 329 227 A1 | 8/1989 | European Pat. Off. . |
| 0 488 628 A2 | 11/1990 | European Pat. Off. . |
| 0 430 493 A2 | 6/1991 | European Pat. Off. . |
| 0 451 571 A2 | 10/1991 | European Pat. Off. . |
| 0 488 264 A3 | 6/1992 | European Pat. Off. . |
| 0 499 241 A1 | 8/1992 | European Pat. Off. . |
| 54-71564 | 8/1979 | Japan . |
| 57-139939 | 8/1982 | Japan . |
| 58-46641 | 1/1983 | Japan . |
| 60-227446 | 11/1985 | Japan . |
| 61-142739 | 6/1986 | Japan . |
| 63-124447 | 5/1988 | Japan . |
| 63-136547 | 6/1988 | Japan . |
| 2-137230 | 11/1988 | Japan . |
| 1-160036 | 6/1989 | Japan . |
| 1-077122 | 9/1989 | Japan . |
| 2 112 566 | 7/1983 | United Kingdom . |
| 2 128 636 | 5/1984 | United Kingdom . |

OTHER PUBLICATIONS

Evaluation of Titanium as a Diffusion Barrier Between Aluminum and Silicon for 1.2 $\mu$m CMOS Integrated Circuits, M. Farahani, et al., Electrochemical Society Active Member, pp. 2835–3845.

Nonconformal Al Via Filling and Planarization by Partially Ionized Beam Deposition for Multilevel Interconnection, S. N. Mei, et al., 1987 IEEE, pp. 503–505.

Aluminum Alloy Planarization for Topography Control of Multilevel VLSI Interconnect, van Gogh, et al., 1987 IEEE, pp. 371–375.

Interconnect Materials for VLSI Circuits, Y. Pauleau, Centre National d'Etudes des Telecommunications, Meylan, France 1987, pp. 155–162.

Planarization of Al Alloy Film During High Rate Sputtering, V. Hoffman, et al., Mar. 1986, Report No. 122, pp. 1–20.

Sputtering and Interconnect Trends, Peter Burggraaf, Semiconductor International, Nov. 1984, pp. 70–73.

TiN formed by evaporation as a diffusion barrier between Al and Si, C. Y. Ting, IBM T. J. Watson Research Center, Yorktown Heights, New York 10598, May 6, 1982, pp. 14–18.

High–temperature contact structures for silicon semiconductor devices, M. Wittmer, Brown Boveri Research Center, 5405 Baden–Dattwil, Switzerland, Sep. 1980, pp. 540–542.

METHOD FOR FORMING A METAL CONTACT

This is a continuation of application Ser. No. 08/146,825, filed Nov. 1, 1993, abandoned; which is a continuation of Ser. No. 07/835,731, filed Feb. 11, 1992, abandoned; which is a continuation of Ser. No. 07/609,883, filed Nov. 05, 1990, U.S. Pat. No. 5,108,951, issued Apr. 28, 1992.

BACKGROUND OF THE INVENTION

1. Field of the Invention

The present invention relates generally to semiconductor integrated circuits, and more specifically to a method for depositing metal layers in integrated circuits so as to form an improved interlevel contact.

2. Description of the Prior Art

In semiconductor integrated circuits, formation of metal interconnect layers is important to the proper operation of these devices. Metal interconnect signal lines make contact to lower conductive layers of the integrated circuit through vias in an insulating layer. For best operation of the device, the metal used to form the interconnect layer should completely fill the via.

Because of its physical properties, aluminum is especially suited for fabrication of metal interconnect lines in integrated circuits. As known in the art and illustrated by the Ono article cited below, aluminum is typically alloyed with small amounts of materials such as silicon. However, the sputtering process used to apply aluminum thin film layers to an integrated circuit generally results in less than ideal filling of contact vias. Large aluminum grains tend to form on the upper surface of the insulating layer. Those grains which form at the edges of the contact via tend to block it before aluminum has a chance to completely fill the via. This results in voids and uneven structures within the via.

This problem is especially acute as integrated circuit devices are fabricated using smaller geometries. The smaller contacts used in these devices tend to have a larger aspect ratio (height to width ratio) than larger geometry devices, which exacerbates the aluminum filling problem.

The uneven thickness of the aluminum layer going into the via, caused by the step coverage problem just described, has an adverse impact on device functionality. If the voids in the via are large enough, contact resistance can be significantly higher than desired. In addition, the thinner regions of the aluminum layer will be subject the well known electromigration problem. This can cause eventual open circuits at the contacts and failure of the device.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because they consume too much area on a chip.

Even with these techniques, the problems of completely filling a via with aluminum are not solved. In part this is due to the fact that aluminum is deposited at a temperature which tends to encourage fairly large grain sizes. Voids and other irregularities within the contact continue to be problems with current technologies.

One technique which has been proposed to overcome the via filling problem is to deposit the aluminum interconnect layers at a temperature between 500° C. and 550° C. At these temperatures, the liquidity of the aluminium is increased, allowing it to flow down into the vias and fill them. This technique is described, for example, in DEVELOPMENT OF A PLANARIZED Al—Si CONTACT FILLING TECHNOLOGY, H. Ono et al, June 1990 VMIC Conference proceedings, pages 76–82. This references teaches that temperatures below 500° C. and above 550° C. result in degraded metal filling of contact vias. It is believed that use of such technique still suffers from problems caused by large grain sizes.

It would be desirable to provide a technique for depositing aluminum thin film layers on an integrated circuit so as to improve coverage in contact vias. It is further desirable that such a technique be compatible with current standard process flows.

SUMMARY OF THE INVENTION

It is therefore an object of the present invention to provide a method for forming an aluminum contact on an integrated circuit.

It is another object of the present invention to provide such a method in which aluminum fills the contact via while minimizing the number of voids formed therein.

It is a further object of the present invention to provide such a method which is compatible with current process technology.

Therefore, according to the present invention, a method is provided for depositing aluminum thin film layers to form improved quality contacts in a semiconductor integrated circuit device. All or some of the deposition process occurs at relatively low deposition rates at a temperature which allows improved surface migration of the deposited aluminum atoms. Aluminum deposited under these conditions tends to fill contact vias without the formation of voids. The low temperature deposition step can be initiated by depositing aluminum while a wafer containing the integrated circuit device is being heated from cooler temperatures within the deposition chamber.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
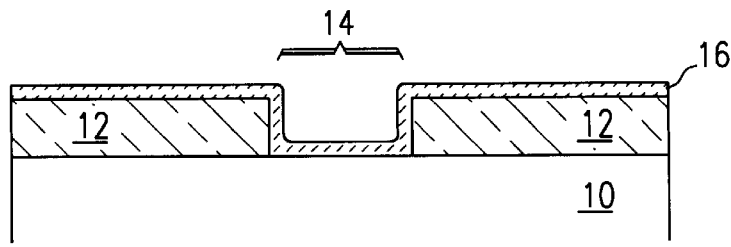
FIGS. 1 and 2 illustrate the formation of a metallic contact according to the present invention.

Referring to FIG. 1, an integrated circuit device is formed in and on a substrate 10. An insulating layer 12, such as a a reflow glass or other oxide layer as known in the art, is formed over the substrate 10. Layer 12 typically has a thickness on the order of approximately 6000–12,000 angstroms. A contact via 14 is formed through the oxide layer 12 using a mask and an isotropic etching technique as known in the art. Via 14 is shown as making contact with substrate 10 in FIG. 1, but may be formed over a lower interconnect layer as known in the art.

A barrier metal layer 16, such as a refractory metal, refractory metal nitride, refractory metal silicide, or combination thereof, is deposited over the surface of the device as known in the art. Layer 16 is relatively thin, typically approximately 500–2000 angstroms angstroms thick, and is deposited conformally to cover the bottom and sidewalls of contact opening 14.

Figure 2:
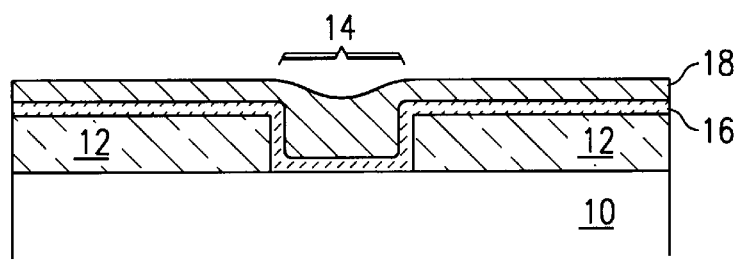

Referring to FIG. 2, an aluminum layer 18 is deposited over the surface of the device. When the aluminum layer 18 is deposited using the process conditions described below, the layer 18 actually completely fills in the via 14 as shown in FIG. 2. This occurs because the preferred process conditions enhance the surface migration of the deposited aluminum atoms, so that aluminum formation in the bottom of the via 14 occurs preferentially to formation on the oxide layer 12 near the edges of the via 14. This ensures a high quality, reproducible contact within the via 14, greatly minimizing the problems caused by incomplete filling of the via 14.

Figure 3:
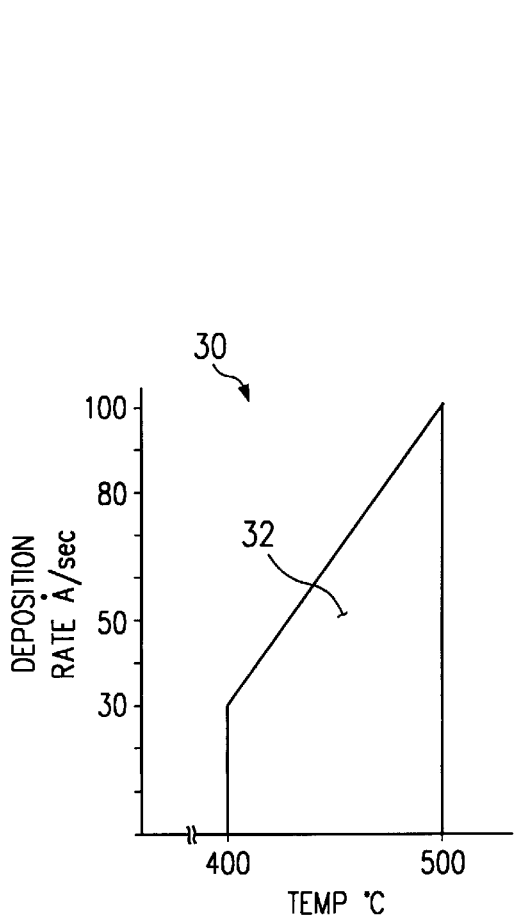
FIG. 3 is a graph illustrating preferred process conditions for formation of an aluminum contact.

FIGS. 3 and 4 illustrate preferred conditions for deposition of the aluminum layer 18 in order to provide an improved contact. Graph 30 illustrates the deposition rate, in angstroms per second, as a function of the deposition temperature in degrees Celsius. The preferred region 32 lies between 400° C.–500° C., with the maximum deposition rate lying below a line extending from a rate of about 30 angstroms per second at 400° C. to 100 angstroms per second at 500° C.

When aluminum is deposited within this preferred region 32, its surface migration characteristics are enhanced over metal deposited under other conditions. For example, depositing aluminum at temperatures higher than 500° C. tends to form large grains, so that blocking of the contact opening occurs as described earlier. If the deposition rate is too high, the deposited aluminum is not able to migrate quickly enough into the via to completely fill it. Therefore, the region 32 depicted in FIG. 3 outlines, approximately, a preferred pairing of processing conditions under which deposited aluminum migrates into the contact via and fills it while minimizing the formation of voids and uneven regions.

Process conditions can be varied slightly from that shown in FIG. 3 without departing from the teachings of the present invention. For example, temperatures a little below 400° C. can be used, as long as the deposition rates are not too high. As the temperature decreases, the mobility of the deposited aluminum atoms goes down, so that incomplete filling of the via occurs if the deposition rates are too high.

FIG. 4 includes four graphs illustrating preferred processes by which an aluminum interconnect layer can be formed. All of these processes utilize, to a greater or lesser degree, processing which occurs within the preferred region 32. Each of the curves 40, 42, 44, 46 illustrates a variation in the aluminum deposition rate with time. Each curve 40–46 illustrates an alternative process utilizing the concepts of the present invention.

Each of the four processes shown in FIG. 4 preferably uses approximately the same set of initial conditions. In the prior art, it is common to deposit a very thin layer of small grain aluminum at a relatively cold temperature, typically below 350° C., and then stop the deposition process. The wafer on which the integrated circuit device is located is then preheated to the required deposition temperature, over 500° C., by bathing the wafer with a stream of preheated argon gas. Once the wafer has reached the deposition temperature, deposition of the aluminum is resumed at such elevated temperature.

In the present technique, aluminum is preferably deposited on the device continuously while the device is being heated. Thus, a small amount of aluminum is deposited on the device while the wafer is at or below 350° C. As the wafer gradually heats to the desired deposition temperature, aluminum deposition continues. This gives a layer of aluminum which is deposited with very small grain sizes, tending to minimize grain size growth at later stages. The deposition temperature is between 400° C. and 500° C., and is typically reached in about 40 seconds.

FIG. 4 shows deposition rate curves for four alternative deposition techniques. For all of the curves in FIG. 4, the initial temperature of the wafer is assumed to be approximately 350° C., with the final deposition temperature being 450° C. Heating the wafer to 450° C. takes approximately 40 seconds. It will be appreciated by those skilled in the art that different deposition temperatures may be used. Once the wafer has heated to the deposition temperature, the temperature remains constant.

Figure 4A:
FIGS. 4(a)–4(d) illustrate several alternative deposition rate diagrams for forming contacts according to the present invention.

Curve 40 in FIG. 4(a) depicts a deposition process in which the deposition rate stays constant during the entire course of depositing the aluminum layer 18. Deposition begins when heat is first applied to the wafer in the chamber, and continues while the wafer heats to 450° C. and remains there. At a rate of 40 angstroms per second, an 8000 angstrom thick aluminum layer will take approximately 200 seconds to deposit.

Figure 4B:
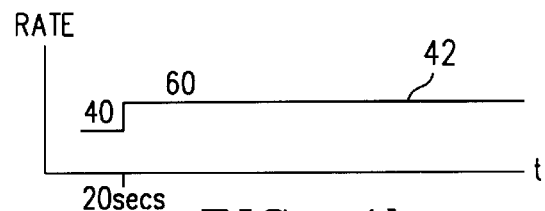

FIG. 4(b) shows an alternative deposition process in which the deposition rate is performed at 40 angstroms per second for the first 20 seconds, and 60 angstroms per second thereafter. The temperature is increasing toward the 450° C. point during the entire deposition step at 40 angstroms per second, and for the first 20 seconds at 60 angstroms per second. For an 8000 angstrom layer, the process curve 42 will result in an aluminum layer formation process which takes approximately 140 seconds.

Curve 44 shows a process in which the initial deposition rate is 40 angstroms per second, followed by an increase to 80 angstroms per second after 20 seconds. After approximately one-third of the entire thickness of the aluminum layer has been deposited, the deposition rate is changed to 30 angstroms per second. This rate is maintained for the deposition of approximately another one-third of the entire layer thickness, followed by an increase of the deposition rate back to 80 angstroms per second.

Figure 4C:
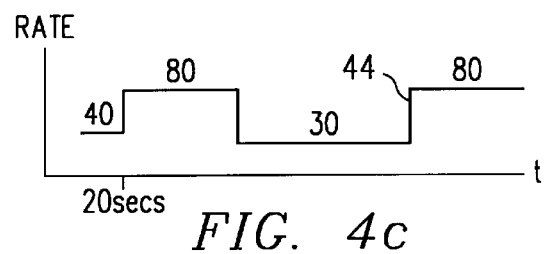
Figure 4D:
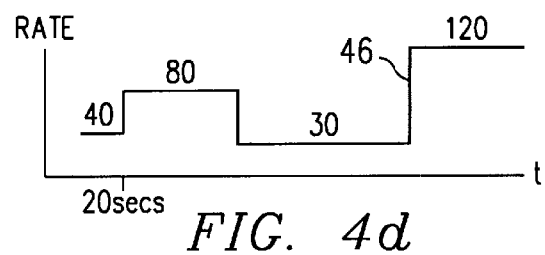

The process depicted by curve 44 will take approximately 160 seconds to deposit an 8000 angstrom layer of aluminum. This assumes that 2400 angstroms are deposited during each of the 80 angstrom per second segments, and during the 30 angstrom per second segment. The process of FIG. 4(c) provides for an initial fast deposition of aluminium, followed by a slow deposition period in which deposited aluminium is given the opportunity to migrate into the contact opening. The 30 angstrom deposition period will last for approximately 80 seconds, in order to deposit 2400 angstroms.

Curve 46 in FIG. 4(*d*) starts in the same manner as curve 44, but ends with a higher deposition rate. Processing time is saved by the faster deposition near the end of the process. By this point in the deposition process, the contact opening has been mostly filled, and the possibility of voiding in the via has been greatly decreased. Thus, there is no harm to depositing aluminum at a rate which falls outside of the preferred region 32.

It will be appreciated by those skilled in the art that the processes shown in FIG. 4 are illustrative and not definitive. Other variations are possible. The precise combination of deposition temperatures and deposition rates can be varied to suit the requirements and restrictions of the particular processes at hand. For example, if large contact openings only are used, faster deposition rates can be made as the voiding problem is not so critical. For processes such as those illustrated by curves 44 and 46, it is not necessary to adhere to a one-third thickness deposition at each rate. These rates and times may be varied to suit the requirements of a production process while still taking advantage of the concepts of the invention.

It is also possible to use the technique of depositing aluminum within the preferred area 32 without continuously depositing aluminum while the wafer temperature is ramping up to the deposition temperature. As is done on the prior art, a thin layer of aluminum can be deposited at relatively cold temperatures, preferably below 350° C. Deposition is then stopped while the wafer is brought to a temperature between 400° C. and 500° C. Deposition is then resumed at a rate within the preferred region 32, and completed using the teachings set forth above. For example, any of the curves in FIG. 4 can be used, with a difference that the initial 40 angstroms per second deposition rate is omitted.

Use of the continuous layer formation while the wafer is being heated, combined with deposition at rates and temperatures within the preferred region 32, results in small deposited aluminum grain size and very good filling of the via. This is caused both by the good electromigration characteristics of the deposited aluminum layer at the temperatures and deposition rates involved, and by the fact that very small initial grain sizes result in smaller final grain sizes, having less tendency to block off the via before it is completely filled.

While the invention has been particularly shown and described with reference to a preferred embodiment, it will be understood by those skilled in the art that various changes in form and detail may be made therein without departing from the spirit and scope of the invention.

What is claimed is:

1. A method for forming an aluminum contact in an integrated circuit, comprising the steps of:

forming an insulating layer over a conducting layer;

forming an opening through the insulating layer to expose a portion of the conducting layer;

forming a barrier layer over the insulating layer, in the opening, and over the exposed portion of the conducting layer;

raising the temperature of the integrated circuit from below approximately 350° C. to a value between approximately 400° C. and approximately 500° C.;

during said temperature raising step, beginning to deposit aluminum on the barrier layer, and continuing to deposit aluminum on the integrated circuit during the remainder of the temperature raising step;

after the temperature raising step, continuing to deposit an aluminum layer on the integrated circuit to a first thickness, at a temperature between approximately 400° C. and approximately 500° C.; and during said first thickness depositing step, controlling the rate at which aluminum is deposited to allow deposited aluminum to migrate into the opening so as to provide a substantially complete fill thereof.

2. The method of claim 1, wherein said step of controlling the rate at which aluminum is deposited comprises the step of:

maintaining the deposition rate to be less than approximately $$(0.7*T)-250 \text{ angstroms/sec}$$

where T lies between approximately 400° C. and approximately 500° C.

3. The method of claim 1, wherein the deposition rate is varied, with one portion being faster than approximately 50 angstroms/sec, and another portion being slower than approximately 50 angstroms/sec.

4. The method of claim 3, wherein a last portion of said deposition step is performed at a deposition rate faster than approximately 100 angstroms/sec.

5. The method of claim 4, wherein a first deposition portion is performed at a rate above approximately 60 angstroms/sec, and a second deposition portion is performed at a rate below approximately 40 angstroms/sec.

6. The method of claim 1, wherein the rate of deposition of aluminum is less than approximately 100 angstroms/sec.

7. The method of claim 1, wherein the rate of deposition for aluminum is changed at least once during the step of controlling the rate at which aluminum is deposited.

8. The method of claim 7, wherein the rate of deposition of aluminum is less during a middle deposition period than during a beginning deposition period and during an ending deposition period.

9. The method of claim 8, wherein the deposition rate is less than approximately 40 angstroms/sec during the middle deposition period, and greater than approximately 50 angstroms/sec during the beginning and ending deposition periods.

10. The method of claim 9, wherein the aluminum deposition rate during the ending deposition period is greater than approximately 100 angstroms/sec.

11. The method of claim 1, wherein aluminum is deposited at a rate which lies within the selected region 32 of FIG. 3.

12. The method of claim 1, wherein the barrier layer comprises a layer containing a refractory metal.

13. The method of claim 1, wherein the step of depositing aluminum during the temperature raising step comprises the steps of:

initially depositing aluminum at a first deposition rate; and changing the deposition rate to a second rate before completion of the temperature raising step.

14. A method for forming an aluminum contact in an integrated circuit, comprising the steps of:

forming an insulating layer over a conducting layer;

forming an opening through the insulating layer to expose a portion of the conducting layer;

forming a barrier layer over the insulating layer, in the opening, and over the exposed portion of the conducting layer;

raising the temperature of the integrated circuit from below approximately 350° C. to a value between approximately 400° C. and approximately 500° C.;

beginning to deposit aluminum on the barrier layer during the step of raising the temperature, wherein deposition begins while the temperature of the integrated circuit is below 350° C., and continuing to deposit aluminum on the integrated circuit during the remainder of the temperature raising step;

after the temperature raising step, continuing to deposit an aluminum layer on the integrated circuit to a first thickness, at a temperature between approximately 400° C. and approximately 500° C.; and during said first thickness depositing step, controlling the rate at which aluminum is deposited to allow deposited aluminum to migrate into the opening so as to provide a substantially complete fill thereof.

15. The method of claim 14, wherein said step of controlling the rate at which aluminum is deposited comprises the step of:

maintaining the deposition rate to be less than approximately $$(0.7*T)-250 \text{ angstroms/sec}$$

where T lies between approximately 400° C. and approximately 500° C.

16. The method of claim 14, wherein the deposition rate is varied during the temperature raising and controlling steps, with one portion being faster than approximately 50 angstroms/sec, and another portion being slower than approximately 50 angstroms/sec.

17. The method of claim 16, wherein a last portion of said deposition step is performed at a deposition rate faster than approximately 100 angstroms/sec.

18. The method of claim 17, wherein a first deposition portion is performed at a rate above approximately 60 angstroms/sec, and a second deposition portion is performed at a rate below approximately 40 angstroms/sec.

19. The method of claim 14, wherein the rate of deposition of aluminum is less than approximately 100 angstroms/sec.

20. The method of claim 14, wherein the rate of deposition for aluminum is changed at least once during the step of controlling the rate at which aluminum is deposited.

21. The method of claim 20, wherein the rate of deposition of aluminum is less during a middle deposition period than during a beginning deposition period and during an ending deposition period.

22. The method of claim 21, wherein the deposition rate is less than approximately 40 angstroms/sec during the middle deposition period, and greater than approximately 50 angstroms/sec during the beginning and ending deposition periods.

23. The method of claim 22, wherein the aluminum deposition rate during the ending deposition period is greater than approximately 100 angstroms/sec.

24. The method of claim 14, wherein aluminum is deposited at a rate which lies within the selected region 32 of FIG. 3.

25. The method of claim 14, wherein the barrier layer comprises a layer containing a refractory metal.

26. The method of claim 14, wherein the step of depositing aluminum during the temperature raising step comprises the steps of:

initially depositing aluminum at a first deposition rate; and changing the deposition rate to a second rate before completion of the temperature raising step.

27. A method for forming an aluminum contact in an integrated circuit, comprising the steps of:

forming an insulating layer over a conducting layer;

forming an opening through the insulating layer to expose a portion of the conducting layer;

forming a barrier layer over the insulating layer, in the opening, and over the exposed portion of the conducting layer;

raising the temperature of the integrated circuit from below approximately 350° C. to a value between approximately 400° C. and approximately 500° C.;

during said temperature raising step, beginning to deposit, by sputtering, a metallic layer consisting essentially of aluminum on the barrier layer and in the opening, and continuing to sputter the metallic layer on to the integrated circuit during the remainder of the temperature raising step;

after the temperature raising step, continuing to sputter a metallic layer consisting essentially of aluminum on the integrated circuit to a first thickness, at a temperature between approximately 400° C. and approximately 500° C.; and during said first thickness depositing step, controlling the rate at which the metallic layer is sputtered to allow deposited material to migrate into the opening so as to provide a substantially complete fill thereof.

28. The method of claim 27, wherein said step of controlling the rate at which aluminum is deposited comprises the step of:

maintaining the deposition rate to be less than approximately $$(0.7*T)-250 \text{ angstroms/sec}$$

where T lies between approximately 400° C. and approximately 500° C.

29. The method of claim 27, wherein the deposition rate is varied during the temperature raising step and the step of controlling the rate at which aluminum is deposited, with one portion being faster than approximately 50 angstroms/sec, and another portion being slower than approximately 50 angstroms/sec.

30. The method of claim 29, wherein a last portion of said deposition step is performed at a deposition rate faster than approximately 100 angstroms/sec.

31. The method of claim 30, wherein a first deposition portion is performed at a rate above approximately 60 angstroms/sec, and a second deposition portion is performed at a rate below approximately 40 angstroms/sec.

32. The method of claim 27, wherein the rate of deposition of metallic material is less than approximately 100 angstroms/sec.

33. The method of claim 27, wherein the rate of deposition for the metallic material is changed at least once during the step of controlling the rate at which aluminum is deposited.

34. The method of claim 33, wherein the rate of deposition of the metallic material is less during a middle deposition period than during a beginning deposition period and during an ending deposition period.

35. The method of claim 34, wherein the deposition rate is less than approximately 40 angstroms/sec during the middle deposition period, and greater than approximately 50 angstroms/sec during the beginning and ending deposition periods.

36. The method of claim 35, wherein the metallic material deposition rate during the ending deposition period is greater than approximately 100 angstroms/sec.

37. The method of claim 27, wherein the metallic material is deposited at a rate which lies within the selected region 32 of FIG. 3.

38. The method of claim 27, wherein the barrier layer comprises a layer containing a refractory metal.

39. The method of claim 27, wherein the step of depositing the metallic material during the temperature raising step comprises the steps of:

initially depositing, by sputtering, a metallic material consisting essentially of aluminum at a first deposition rate; and changing the deposition rate to a second rate before completion of the temperature raising step.

* * * * *